May 31, 1966 J. R. GARCIA ETAL 3,254,274

MOUNTING APPARATUS FOR ELECTRONIC DEVICES

Filed Sept. 26, 1961 3 Sheets-Sheet 1

INVENTORS
JOSEPH R. GARCIA
LESLIE A. HARLOW
BY
Wesley De Bruin
ATTORNEY

May 31, 1966 J. R. GARCIA ETAL 3,254,274

MOUNTING APPARATUS FOR ELECTRONIC DEVICES

Filed Sept. 26, 1961 3 Sheets-Sheet 2

MOUNTING APPARATUS FOR ELECTRONIC DEVICES

Filed Sept. 26, 1961 3 Sheets-Sheet 3

United States Patent Office 3,254,274
Patented May 31, 1966

3,254,274

MOUNTING APPARATUS FOR ELECTRONIC DEVICES

Joseph R. Garcia, Poughkeepsie, and Leslie A. Harlow, Fishkill, N.Y., assignors to International Business Machines Corporation, New York, N.Y., a corporation of New York Filed Sept. 26, 1961, Ser. No. 140,878
6 Claims. (Cl. 317—234)

This invention relates to the packaging of microminiature electronic components and, more particularly, to arrangements for rigidly mounting semiconductor devices.

Semiconductor devices, such as diodes or transistors, are conventionally fabricated with desired electrical characteristics by first alloying dots of impurity material with a semiconductor wafer to form the respective PN junctions of the device. Thereafter, conductive strips, such as nickel conductors, are affixed to the electrodes and the strips, in turn, are bonded to a supporting header. Both of the latter steps require that additional heat be applied to the junctions causing further impurity diffusion within the semiconductor wafer thereby affecting the electrical characteristics of the device. Moreover, the resultant structures lack mechanical rigidity and require substantial packaging space. As such, conventionally mounted devices do not lend themselves to the fabrication of composite structures by printed circuit techniques.

Accordingly, it is a primary object of the invention to provide a microminiature mounting and housing arrangement for electronic components, such as semiconductor devices, which is readily adaptable to the fabrication of electronic circuitry and components by conventional printed circuit techniques.

It is another object of the invention to provide a mounting and housing arrangement for semiconductor devices that requires substantially less space than that required for conventional arrangements.

It is a further object of the invention to provide a packaging arrangement for semiconductor devices which permits the manufacturing process of the device to be substantially simplified and which eliminates the adverse conditions that the devices are subjected to when conventional arrangements are fabricated.

It is a further object of the invention to provide a mechanically rigid packaging arrangement for a semiconductor device having conductive connections as a part of the package for connecting the device to external circuitry.

In accordance with an aspect of the invention, there is provided a packaging arrangement for a multi-electrode microminiature electronic device, such as a semiconductor device. The package comprises a non-conductive member having a plurality of surfaces and an irregularly-shaped recess therein for receiving the device. The recess has a configuration defining at least one contact area enabling one of the electrodes of the device to be physically seated thereon for mechanically supporting the device. Conductive films, corresponding in number to the number of electrodes, are discretely carried by the surfaces of the members in electrical communication with the electrodes of the device for acting as terminal members.

A feature of the invention enables jet etching techniques to be employed in processing the junction of the semiconductor device when mounted in the non-conductive member.

Another feature of the arrangement of the invention provides for the composite fabrication of electronic components in logic circuits or memory arrays.

The foregoing and other objects, features and advantages of the invention will be apparent from the following more particular description of the preferred embodiments of the invention, as illustrated in the accompanying drawing, wherein.

Figure 7A:
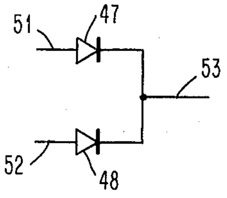
Figure 7:
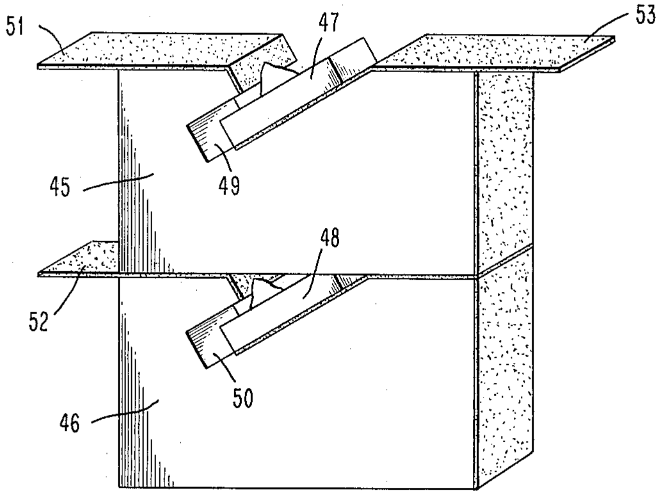
Figures 8, 8A, 9, 9A:
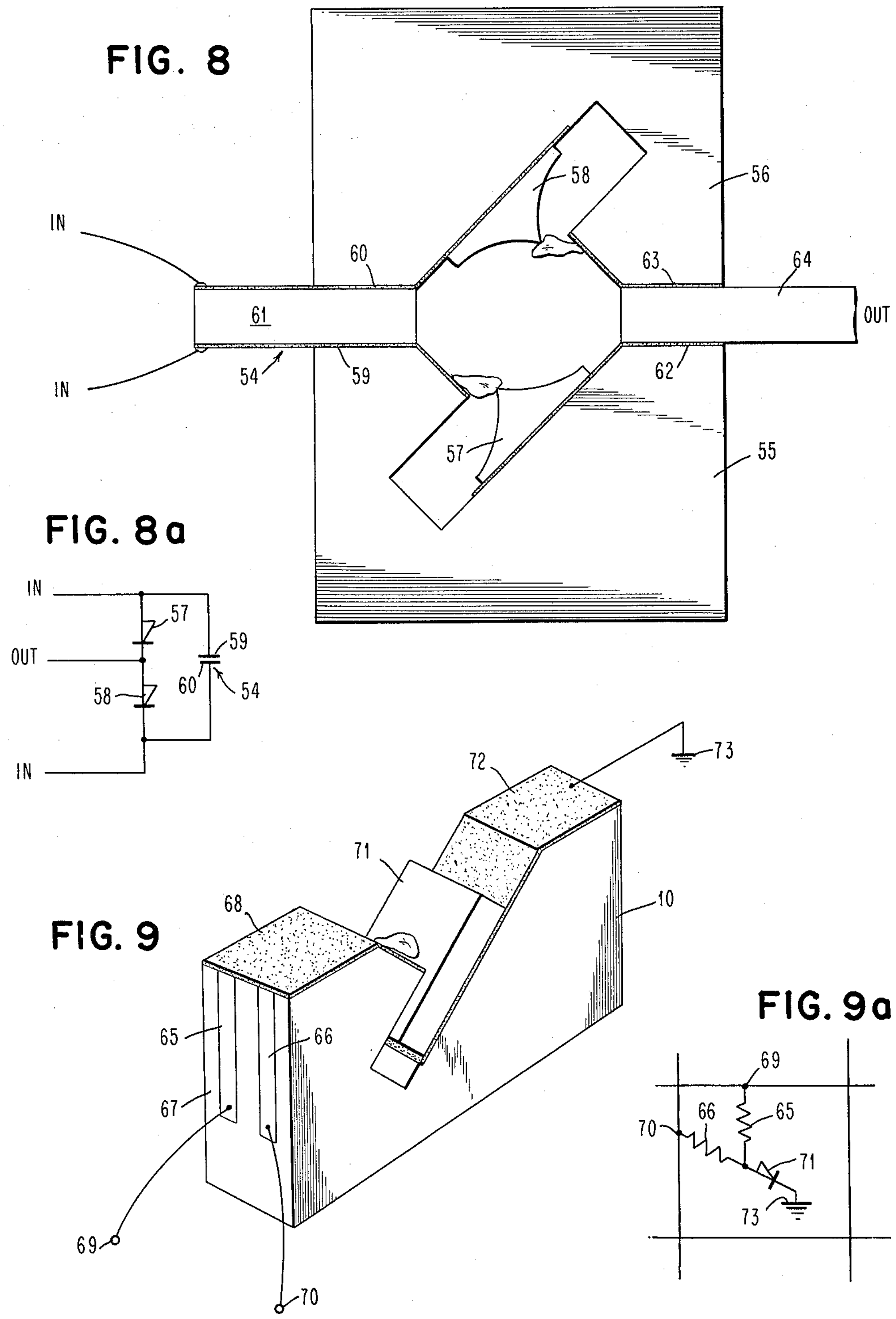

FIGS. 7, 8, and 9 depict various applications of the mounting arrangement of the invention; and FIGS. 7*a*, 8*a*, and 9*a* are circuit diagrams illustrative of the electrical equivalents of the arrangements of FIGS. 7, 8, and 9, respectively.

Figure 1:
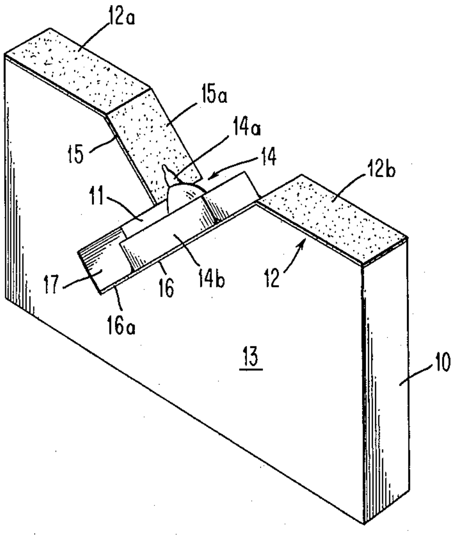
FIG. 1 is a perspective view of one form of the mounting arrangement for a semi-conductor device having a recess therein for receiving the device.

Referring now to FIG. 1, a mounting block or housing of substantially rectangular parallelpiped shape is indicated by the reference number 10. The block is fabricated of an insulating material, such as ceramic or glass to provide a mechanically rigid structure for supporting an electronic componenet, such as a semiconductor device. Alumina oxide is one such insulator which accomplishes this function extremely well, since its coefficient of heat expansion is approximately the same as that of the semiconductive material germanium.

An essentially Y-shaped recess or cavity 11 extends inwardly from the upper surface 12 of the block in communication with the sides 13 of the block. Thus, a receptacle is formed to receive the component, such as the semiconductor diode 14. It is, of course, obvious that the shapes of the block and recess are not limited to those described, but may assume any shape which will enable the purposes of the invention to be carried out.

Conductive film strips **12*a*–*b* are affixed along the upper surface 12 of the block and extend inwardly at 15*a*–16*a* into the recess 11 along the surfaces 15–16. The surface of the recess 17 between the surfaces 15–16 is not coated with the conductive film material but rather serves as an insulator between the portions 15*a*–16*a* preventing any short circuits from occuring when the diode 14** is inserted into the recess. The strips may have a molybdenum-manganese constituency with a nickel plate surface. In this form, they may be plated by evaporation on the specified surfaces of the block. Additionally, an epoxy silver compound may be brushed on the block surfaces to act as the conductive film elements.

It is readily apparent that the arrangement of the block with the Y-shaped recess is advantageous, since it permits the designated surfaces to be coated in a single manufacturing operation without having to block or mask certain areas. This may be accomplished by directing the coating apparatus in a downward direction at the block 10. All exposed surfaces are plated and those that are sheltered, such as 17, remain unplated since the Y-shaped configuration masks these surfaces.

As is well known in the art of manufacturing semiconductor devices, a diode is formed by alloying (at a temperature of approximately 600° C.) an appropriate impurity dot, such as indium, to a wafer of semiconductive material, such as germanium. The alloyed unit is thereafter fabricated to provide a particular PN junction having desired electrical characteristics and then mounted to supporting structure. The steps involved in these conventional processes require that the unit be subjected to additional heat stages which often cause further impurity diffusion within the unit affecting its electrical characteristics.

By employing the mounting arrangement of the invention, these deleterious steps may be eliminated. The alloyed unit 14 is inserted in the recess 11 of the mounting block 10, so that the impurity dot 14*a* and the wafer 14*b* make physical contact with the conductive surfaces 15*a*–16*a*, respectively. The entire structure is subjected to heat of the order of 250°–300° C. (which is substantially lower than the alloying temperature) to wet out the semiconductive materials to the conductive film strips 15*a*–16*a*. A secure bond is achieved which rigidly holds the unit 14 in position within the recess and provides electrical connection to the electrodes of the device.

Figure 2:
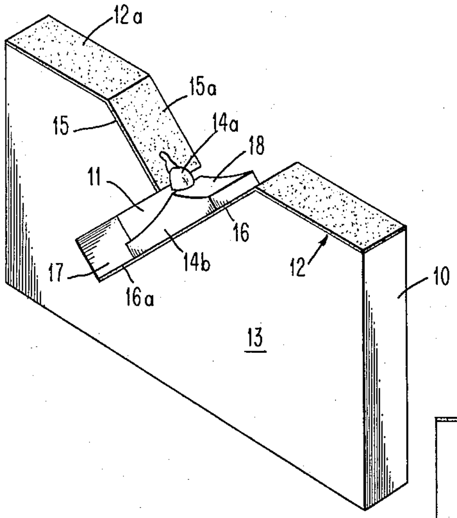
FIG. 2 is a perspective view of the package of FIG. 1 after the semiconductor device has been fabricated.

As already implied and as shown in FIG. 1, the diode 14 is not completely fabricated, since the PN junction formed between the dot of impurity material 14*a* and the wafer of semiconductive material 14*b* has not been processed to provide a device with particular electrical characteristics. However, the mounting arrangement of the invention readily permits etching techniques to be employed in processing the device. Since communication is provided between the sides 13 of the block through the recess 11, etching fluid, such as sodium hydroxide, may be directed at the junction area for removing excess material to obtain a PN junction with desired characteristics. As shown in FIG. 2, the completely processed diode 14 has a wedge-shaped portion 18 in contact with the dot 14*a* of impurity material.

This process and the apparatus employed is described with greater particularity in copending application, Serial No. 106,372, filed April 28, 1960, in the name of Edward M. Davis, Jr., and assigned to the same assignee as this invention. As stated in this application, the etching process may be employed with a tunnel diode to arrive at particular electrical characteristics of peak current by reducing the thickness of the junction to the range of 10 to 25 microns.

Some of the advantages of the mounting arrangement have already been stated. It is obvious, of course, that there are many more. For example, the completed package, when compared with a conventional package, provides substantially more mechanical rigidity for the device and achieves a reduction in the space required to house it by an order of magnitude of at least ten to one. In addition, the arrangement of FIG. 2 eliminates the need for conducting leads, which can affect the reliability of the device, and provides for the use of the package in any position by soldering it directly to conducting lands on printed circuit boards.

Figures 3, 4:
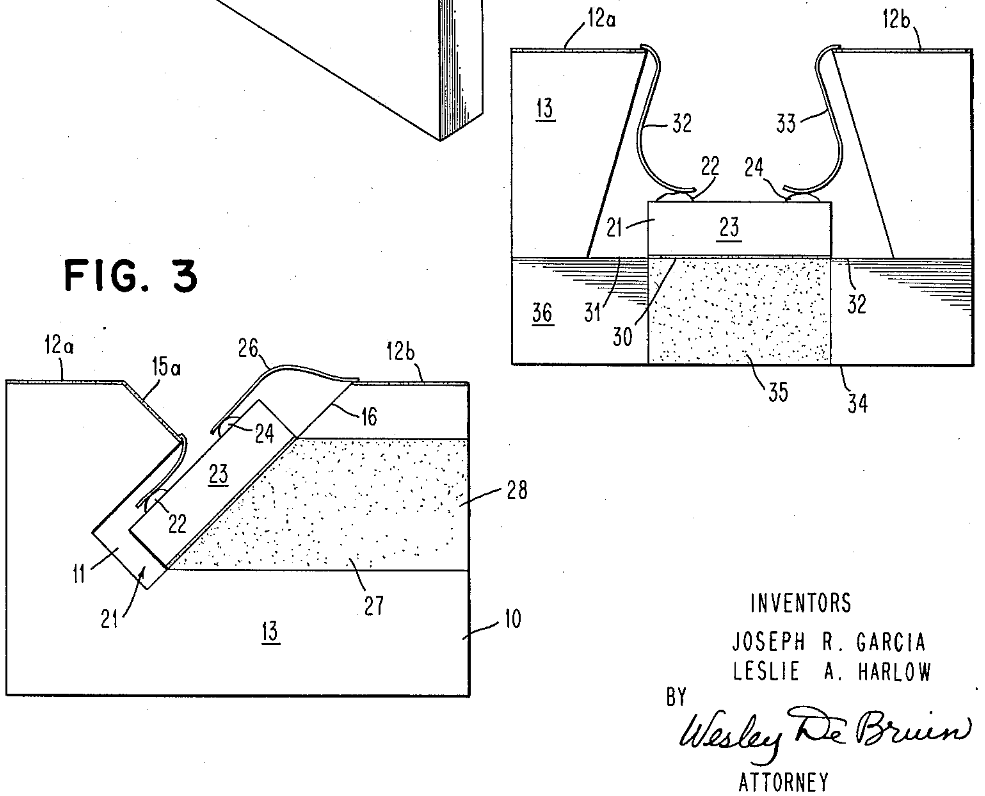
FIG. 3 is a side view of a mounting arrangement including a transistor in the recess of the mounting block.
FIG. 4 is a side view of a mounting arrangement having a trapezoidal recess in the mounting block for receiving a transistor.

The inventive features are also readily adaptable for use with other types of components. For example, as shown in FIGS. 3 and 4, a transistor 21 having emitter, base and collector electrodes 22, 23 and 24, respectively, may be mounted in the block 10. In FIG. 3, the recess has the same configuration as previously described with respect to FIGS. 1 and 2. Wire contact leads 25 and 26 are provided to make electrical connection between the emitter and collector electrodes 22 and 24, respectively. The leads 25–26 are affixed to the conductive films 15*a* and 12*b*, respectively. In order to establish electrical connection to the base electrode 23 of the transistor, a conductive film 27 is affixed to a side surface 13 of the block 10 for electrically connecting the surface 16 of the recess to an outer edge 28 of the block.

In FIG. 4, the mounting block is formed with a recess 11 having an essentially trapezoidal-shape so as to define an exposed contact area 30 between two sheltered areas 31–32. The emitter and collector electrodes 22 and 24 are again connected by wire contact leads 32–33 to the conductive film surfaces 12*a*–*b*, respectively. The base electrode 23 is connected to an external edge 34 of the block by a conductive film 35 which is affixed to the contact area 30 as well as to a flanged portion 36 of the side 13. In this arrangement, the flanged portion 36 enables the conductive films to be applied in a single manufacturing operation as previously described.

Figure 5:
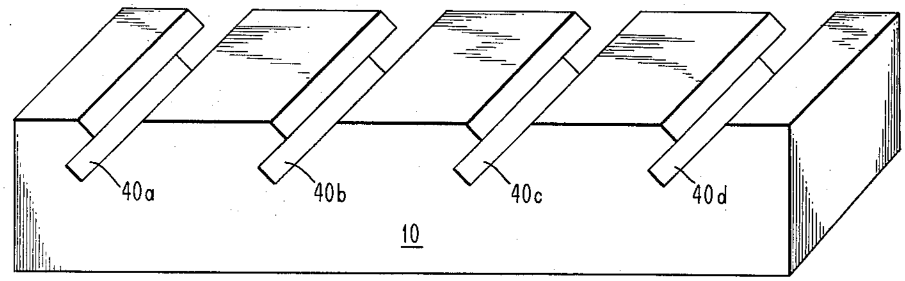
FIG. 5 is a perspective view of a mounting block having a plurality of recessed portions.

Referring to FIG. 5, the mounting block or housing 10 may be constructed to accommodate a plurality of components (not shown) connected in any desired electrical circuit configuration. In each instance, one or more components may be mounted in each of the recesses 40*a*–*d* in the manner already described. The conductive films associated with each device may be applied so as to obtain the desired circuit configuration. Such an arrangement could find usage as one column or row of a memory array when devices, such as tunnel diodes, are used as the storage elements for the memory. It is also apparent that the configuration of the block as shown in FIG. 5 may be extended in a lateral direction so that an entire array could be fabricated on one substrate. A further feature of such a multi-recessed block is that it permits a plurality of devices to be mounted and processed in automated manner and thereafter separated one from another into a plurality of sub-blocks of desired circuit configuration.

Figure 6:
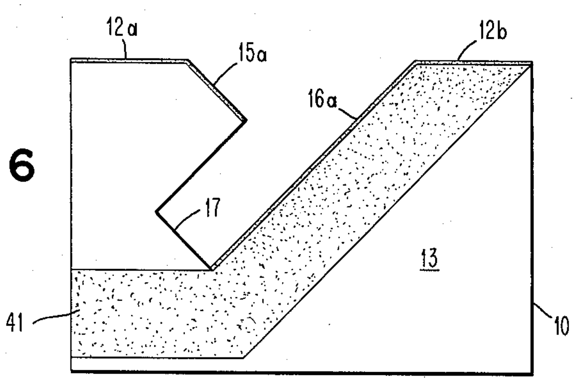
FIG. 6 is a side view of a mounting block having another form of conductive film pattern.

The arrangement of the invention also provides for the application of the conductive films in various patterns for achieving a particular circuit configuration. One example of this is shown in FIG. 6, where connection from the conductive film 16*a* to external circuitry may be made at the surface 12*b* or the block edge 41 by simply coating with a conductive film a portion of the side 13 of the mounting block.

In addition to the variations which may be made in the mounting block or in the recess configuration or in the patterns of conductive films applied to the mounting block, the principles of the invention also permit a variety of circuit functions to be performed by simply connecting a number of blocks together in a particular manner. As shown in FIG. 7, a diode logic circuit may be formed by simply stacking two mounting blocks 45–46 in stacked vertical relationship. The diodes 47–48 are mounted in the respective recesses 49–50 of the blocks. Input circuit connection to the diodes is provided by the conductive films 51–52 and a common output connection is provided by the film 53. The circuit equivalent for such an arrangement is shown in FIG. 7*a*. By simply changing the pattern of conductive films any numbers of various configurations may be obtained.

Referring to FIG. 8, a capacitive element 54 may also be connected in a circuit arrangement formed by the blocks 55–56 having tunnel diodes 57–58 mounted therein. In this configuration, the input conductive films 59–60 act as the plates of the capacitive element and are separated by a dielectric 61. The conductive films 62–63 along with a terminal element 64 positioned between them act at the circuit output connection. As shown in the electrical circuit equivalent of this arrangement (FIG. 8*a*), the capacitive element 54 shunts the series connected diodes 57–58.

A further application of the inventive arrangement is shown in FIG. 9. Resistive films 65–66 are affixed to an end surface 67 of the block 10 and in conjunction with the conductive film 68 electrically connect input terminals 69–70 to a tunnel diode 71 mounted in the recess of the block. Connection is made to a second conductive film 72 of the block from a reference potential 73 enabling the block to serve as a switching circuit or an information storage cell of a memory array. As shown in the circuit of FIG. 9*a*, the tunnel diode 71 acts as a storage element. The resistors 65–66 serve to adjust the operating characteristics of the diode and, also, couple switching pulses to it from appropriate driver circuits.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. Mounting apparatus for a microminiature electronic device having plurality of electrodes comprising a non-conductive member having a plurality of surfaces including an upper surface, a recess extending from the upper surface into said member for reception of the electronic device, said recess having an inclined configuration so that the upper surface partially overhangs the recess to provide, downwardly in relation to the upper surface, an exposed contact area and a sheltered area, said contact area having a conductive film thereon so that the electronic device can be seated thereon and have one of the electrodes of the device connected thereto, said upper surface having conductive film thereon extending to the recess and adapted to be connected to an electrode of the device when the device is received in the recess, and said sheltered area being free of conductive film.

2. The mounting apparatus according to claim 1 and being further characterized by said recess being substantially Y-shape to provide a second contact area which has a conductive film connected to the upper surface conductive film.

3. The mounting apparatus according to claim 1 and being further characterized by said recess being essentially trapezoidal-shape which diverges downwardly from the upper surface.

4. Mounting apparatus for a microminiature electronic device having a plurality of electrodes, comprising a non-conductive member having a plurality of surfaces and a partially sheltered recess therein which communicates with at least one of said surfaces so that a device is receivable in the recess, said recess having a configuration defining at least one contact area, so that when the device is received in said recess one of said electrodes is physically seated thereon to provide mechanical support for said device, a plurality of conductive films corresponding in number to the number of electrodes of said device, each of said films being discretely carried by at least one of said surfaces, whereby each of said films electrically communicates with said recess for acting as electrode terminal members, and said recess being substantially Y-shape to provide a projecting arm for acting as a second contact area for physically supporting a second of the electrodes when the device is received in the recess.

5. The apparatus of claim 4 wherein said recess also communicates with two other surfaces of said member, said other surfaces being orthogonally disposed with respect to said one surface, so that when a semi-conductor device is disposed within said recess access can be made to the device by an etching fluid to etch the device to desired electrical characteristics.

6. Mounting apparatus for a semiconductor device having a PN junction and a plurality of electrodes, comprising a non-conductive member having a plurality of surfaces and a recess with a configuration of substantially Y-shape therein which communicates with three of the surfaces of said member and defines first and second contact areas separated by a third area, conductive films disposed on said first and second contact areas and extending to discrete surfaces of said member for acting as terminal members for the device, so that when the device is disposed within said recess physical contact is made by respective electrodes of the device with the conductive films to provide mechanical support and conductive contact for the device and access of an etching fluid is permitted to the PN junction to process the device electrical characteristics.

References Cited by the Examiner

UNITED STATES PATENTS 2,918,287 12/1959 Rosenblum ---------- 317—101

JOHN W. HUCKERT, *Primary Examiner.*

JAMES D. KALLAM, LEONARD ZALMAN, *Assistant Examiners.*